(12) United States Patent
Roche

(10) Patent No.: US 9,414,532 B2
(45) Date of Patent: Aug. 9, 2016

(54) ELECTRONIC POWER MODULE ARRANGEMENT

(71) Applicant: SAGEM DEFENSE SECURITE, Boulogne Billancourt (FR)

(72) Inventor: Olivier Roche, Boulogne Billancourt (FR)

(73) Assignee: SAGEM DEFENSE SECURITE, Boulogne Billancourt (FR)

( * ) Notice: Subject to any disclaimer, the term of this patent is extended or adjusted under 35 U.S.C. 154(b) by 0 days.

(21) Appl. No.: 14/401,416

(22) PCT Filed: May 13, 2013

(86) PCT No.: PCT/EP2013/059762
§ 371 (c)(1),
(2) Date: Nov. 14, 2014

(87) PCT Pub. No.: WO2013/171136
PCT Pub. Date: Nov. 21, 2013

(65) Prior Publication Data
US 2015/0077942 A1    Mar. 19, 2015

(30) Foreign Application Priority Data

May 16, 2012 (FR) ...................... 12 54521

(51) Int. Cl.
*H05K 7/20* (2006.01)
*H01L 23/373* (2006.01)
(Continued)

(52) U.S. Cl.
CPC ............ *H05K 7/2089* (2013.01); *H01L 23/053* (2013.01); *H01L 23/3735* (2013.01); *H01L 23/49811* (2013.01); *H01L 25/162* (2013.01);
(Continued)

(58) Field of Classification Search
CPC ............ G06F 1/20; G06F 1/203; G06F 1/206
USPC .......... 361/708, 707, 704, 709, 710, 712, 713
See application file for complete search history.

(56) References Cited

U.S. PATENT DOCUMENTS 5,291,065 A * 3/1994 Arai ................... H01L 23/5385
257/691
6,963,195 B1 * 11/2005 Berkcan ............... G01R 15/183
324/117 R
(Continued)

FOREIGN PATENT DOCUMENTS

DE   39 30 858 A1   3/1990
DE   40 34 674 A1   8/1991
(Continued)

*Primary Examiner* — Anthony Haughton
(74) *Attorney, Agent, or Firm* — Muncy, Geissler, Olds & Lowe, P.C.

(57) ABSTRACT

The invention provides an electrical power module, including power transistors, and control components for controlling said power transistors, said module being cooled, in particular, by heat conduction. The module of the invention further includes a main substrate of the AMB/Si3N4 type carrying the power transistors, this main substrate itself constituting a heat-dissipating baseplate for dissipating the heat generated by the power transistors by being arranged in the module to be directly in contact with the carrier structure that provides cooling by conduction when said module is in place, and a ceramic substrate carrying the control components, this ceramic substrate itself being carried by the main substrate.

6 Claims, 3 Drawing Sheets

(51) Int. Cl.
   *H01L 23/498*   (2006.01)
   *H01L 25/16*    (2006.01)
   *H01L 23/053*   (2006.01)
(52) U.S. Cl.
   CPC .... *H05K 7/2039* (2013.01); *H01L 2224/48227* (2013.01); *H01L 2924/19107* (2013.01)

(56) References Cited

U.S. PATENT DOCUMENTS

| | | | | |
|---|---|---|---|---|
| 8,104,358 | B1* | 1/2012 | Jia | G01B 7/22 73/780 |
| 2004/0230114 | A1* | 11/2004 | Clatterbaugh | A61M 25/00 600/435 |
| 2007/0021599 | A1* | 1/2007 | Markowitz | C07K 14/4702 536/23.5 |
| 2009/0057929 | A1* | 3/2009 | Sasaki | H01L 23/3107 257/796 |
| 2009/0140399 | A1 | 6/2009 | Schulz et al. | |
| 2009/0261472 | A1 | 10/2009 | Bayerer | |
| 2011/0069458 | A1* | 3/2011 | Nakao | H01L 25/072 361/728 |

FOREIGN PATENT DOCUMENTS

| | | |
|---|---|---|
| DE | 94 03 108 U1 | 4/1994 |
| DE | 10 2006 051454 A1 | 9/2007 |
| DE | 10 2008 025705 A1 | 3/2009 |
| EP | 0 547 877 A2 | 6/1993 |
| FR | 2 816 462 | 5/2002 |
| WO | WO 2004/002204 A1 | 12/2003 |

* cited by examiner

ELECTRONIC POWER MODULE ARRANGEMENT

The invention relates to an electrical power module that is designed to be used in an application of the aviation type by being adjoined to the actuator that it controls, which requires high reliability in a severe environment, and low weight and low volume.

BACKGROUND OF THE INVENTION

Such an inverter module is designed to be interposed between an electricity source and an electromagnetic actuator, for injecting an electrical power signal into the electric motors of the actuator, which power signal has a frequency that depends on a command that is sent to the module and that varies over time.

By way of example, that type of module may be used to move a flap or some other aerodynamic element of the aircraft as a function of commands and of operating conditions that can vary continuously.

In practice, such a module receives control instructions, and, as a function of those instructions, it adjusts the frequency of the power signal that it delivers to the actuator, and other parameters of said power signal.

Such a module, a portion of which is shown in diagrammatic section in FIG. 1 and is referenced 1 therein, includes power transistors 2 that are carried by power substrates 3 which are themselves carried by a copper baseplate 4 in order to dissipate heat generated by the power transistors. It also includes control components 6 that control the power transistors while being carried by another substrate 7, and an interface card 8 that is provided with other components 9.

As visible in FIG. 1, the substrate 7 carrying the control components 6 is situated above the assembly formed by the power substrates 3 and the baseplate 4 that carries them, while also being spaced apart from said assembly, thereby making it possible to reduce the length of the connections 11 connecting the control components to the power transistors 2.

The power substrates 3, which are generally of the Direct Bonded Copper/Aluminum Oxide (DBC/$Al_2O_3$) type, have copper tracks on their top faces for receiving the power transistors 2, and their bottom faces are coated with copper.

Each power substrate 3 is secured to the copper baseplate 4 by being soldered to the top face of said baseplate, and said copper baseplate 2 has its opposite face adjoining a carrier structure constituting a heatsink for cooling the module 1 by conduction when the assembly is in place, the hottest portions of said module being its power transistors.

OBJECT OF THE INVENTION

An object of the invention is to propose an electrical power module structure that is of reliability, compactness, and weight that are more satisfactory than with known modules.

SUMMARY OF THE INVENTION

To this end, the invention provides an electrical power module, including power transistors, and control components for controlling said power transistors, said module being cooled by heat conduction, and said electrical power module being characterized in that it further includes:

a main substrate of the Active Metal Bonding/Silicon Nitride (AMB/$Si_3N_4$) type carrying the power transistors, this main substrate itself constituting a heat-dissipating baseplate for dissipating the heat generated by the power transistors by being arranged in the module to be directly in contact with the carrier structure that provides cooling by conduction when said module is in place; and a ceramic substrate carrying the control components, this ceramic substrate itself being carried by the main substrate.

With this arrangement, an additional layer of copper is no longer necessary because the heat dissipation is provided directly by the substrate carrying all of the power transistors. The number of components of the module is thus reduced, thereby making it possible to increase its reliability, to reduce its weight, and to increase its compactness.

The invention also provides a module as defined above, wherein the tracks of the main substrate and the tracks of the ceramic substrate carried by said main substrate are interconnected by wires, each of which has one end bonded to a track of the main substrate and another end bonded to a track of the ceramic substrate.

The invention also provides a module as defined above, wherein the ceramic substrate is of the thick-layer alumina type.

The invention also provides a module as defined above, further including power connection pads, each of which is in the form of a strip of conductive metal sheet cut out and folded to hold a clamping nut captive, each pad being fastened to the main substrate by bonding one or more ends of the folded strip of metal sheet of which it is made to a track of said substrate, each nut being arranged to receive a fastening bolt for fastening a power supply member to the pad.

The invention also provides a module as defined above, further including a power bus in the form of a laminated part made up of layers of copper and of Kapton and having terminals in the form of holes, this bus being fastened to the remainder of the module by means of fastening bolts passing through the module and being screwed into the pads.

The invention provides a module as defined above, including a metal chassis, and wherein the power bus has a layer of copper that is in abutment against the chassis when the bus is in place, in such a manner as to co-operate with the chassis to constitute a Faraday cage.

DETAILED DESCRIPTION OF THE INVENTION

The basic idea of the invention is to group together the power transistors on a suitable single common main substrate, so as to avoid the need for an additional heat-dissipating baseplate. This makes it possible to reduce the dimensions and the weight of the resulting assembly, while also eliminating the reliability uncertainties caused by soldering the power substrates to the copper baseplate.

Such soldering constitutes a source of failure for known modules due to the differential expansion to which the modules are subjected, thereby stressing the soldering to the point of cracking it, or indeed of destroying it.

More precisely, in accordance with the invention, the main substrate supporting the power transistors is a single substrate of the AMB/$Si_3N_4$ type. A substrate of this type has mechanical and thermal characteristics that give it increased mechanical and thermal strength over operating cycles, so that it can also constitute the heat-dissipating baseplate without any risk of being degraded.

Figure 1:
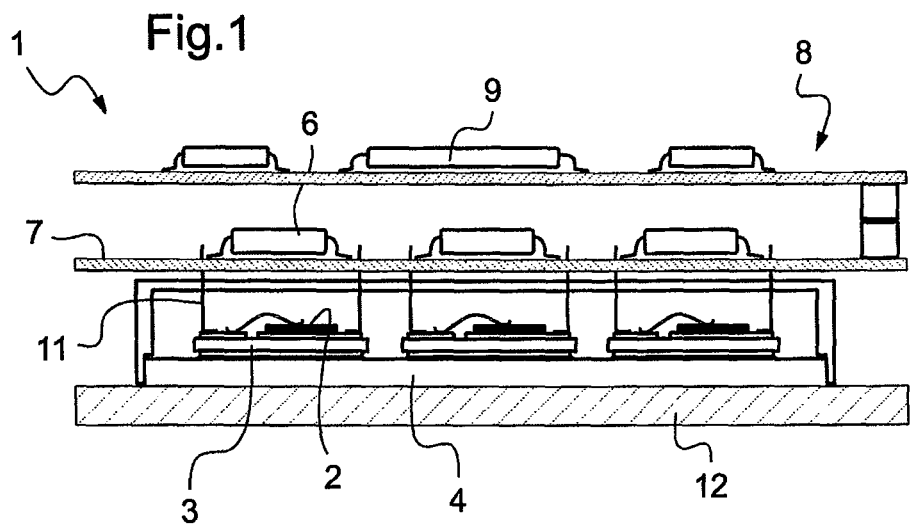
FIG. 1 (described above) is a fragmentary diagrammatic section view of a module arrangement that is known from the state of the art.
Figure 2:
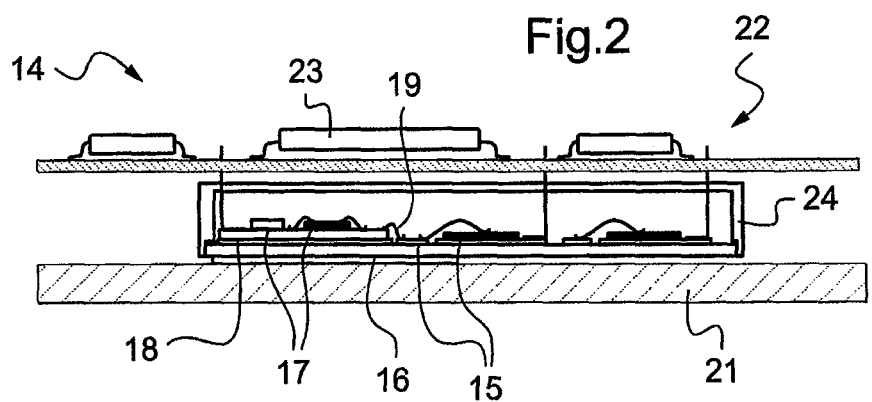
FIG. 2 is a fragmentary diagrammatic section view of the arrangement of the invention.
Figure 3:
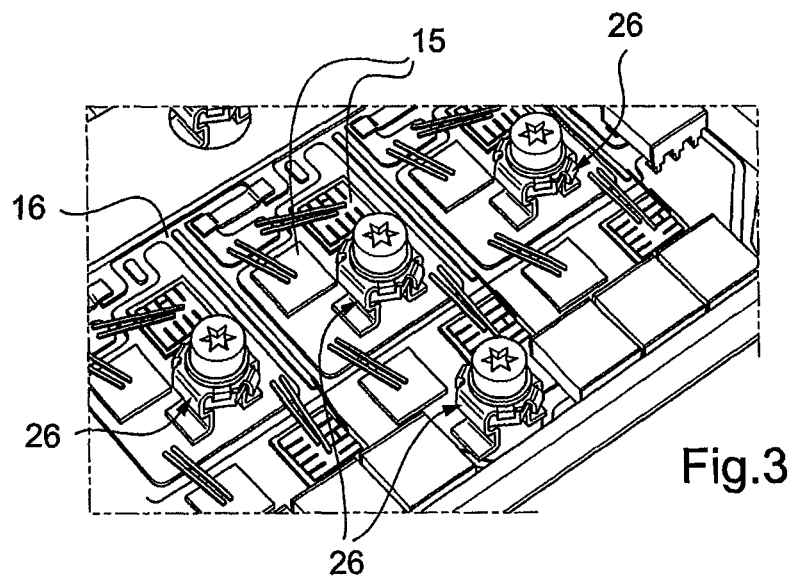
FIG. 3 is a view showing the power connection pads carried by the main substrate of the module of the invention.

In the module of the invention that is shown diagrammatically in FIG. 2, and that is referenced 14 therein, the various power transistors 15 making up the power bridge of the module are carried by a common main substrate 16, of the AMB/$Si_3N_4$ type, that is provided with copper tacks in its top face, and that also has its bottom face made of copper.

In order to improve compactness further, the control components 17 and their associated power supply circuits, which control the power transistors 15, and also temperature probes, are carried by a substrate made of ceramic 18 that is itself carried directly by the main substrate 16 while being adhesively bonded thereto.

Advantageously, the ceramic substrate 18 is of the thick-layer alumina type, so as to have good thermal conductivity in order to facilitate effective removal of the heat generated by the control components.

All of the power transistors and all of the components that control them are thus grouped together on the same common support constituted by the main substrate 16 that also acts as a heat-dissipating baseplate.

As shown in FIG. 2, the control components 17 are connected to the power transistors 15 via bondwires 19 that connect the tracks situated on the top face of the ceramic substrate 18 to the tracks situated on the top face of the main substrate 15.

As in the state of the art, each power transistor 15 is connected to a track of the power substrate 16 by being bonded (welded) directly to said track, and it is connected to another track of the top face of said substrate via a wire bonded (welded) to a top face of the transistor and to the track in question, the power transistors used being transistors that do not have protective packages.

As shown in FIG. 2, the main substrate 16 is mounted directly against the carrier structure 21 that forms a heatsink when the module of the invention is in place, in such a manner as to cool the power transistors effectively. In other words, the main substrate at the base of the assembly of the invention also constitutes the heat-dissipating baseplate for the module.

In addition, the control components carried by the ceramic substrate are physically very close to the power transistors that they control, thereby imparting better functional behavior to the system.

An interface card 22 carrying other components 23 may be placed above the assembly constituted by the power substrate 16 with the various elements that it carries, namely the power transistors, the ceramic substrate, and the control components. This interface card 22 is then spaced apart from the assembly constituted by the main substrate 16 with the elements that it carries, while extending parallel to that assembly.

In complementary manner, a metal frame 24 that is adhesively bonded to the power substrate makes it possible to fasten the substrate with its elements to the interface card 22 while defining an internal space enclosing the power transistors and their control members. This internal cavity is advantageously filled with a gel for protecting the electronics.

As indicated above, the electrical module is subjected to cyclical temperature variations that are considerable, giving rise to differential expansion that can stress its components mechanically to the point of degrading them.

In this context, the module of the invention is equipped with power connection pads 26 carried by its main substrate 16 for powering the module, and via which said module delivers its power signal. In accordance with the invention, said pads are designed to have a certain amount of flexibility in order to withstand the effects of differential expansion better.

Figure 5:
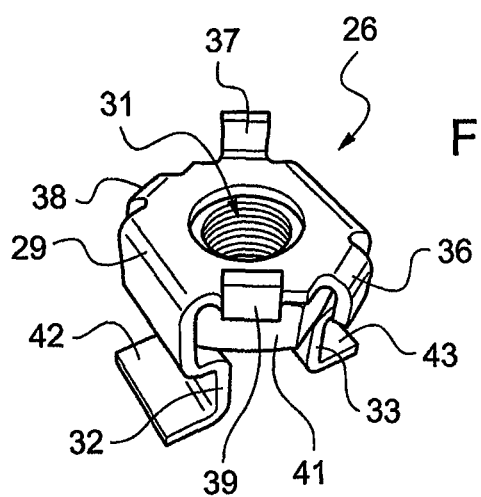
FIG. 5 is a perspective view from above of a power connection pad of the module of the invention.

As can be seen in FIG. 5, each pad 26 has a sheet-metal element that is cut out and folded firstly to hold a nut captive and secondly to define two end tabs that are folded back in such a manner as to be coplanar so as to enable it to be fastened by soldering to a track of the substrate 16.

Figure 6:
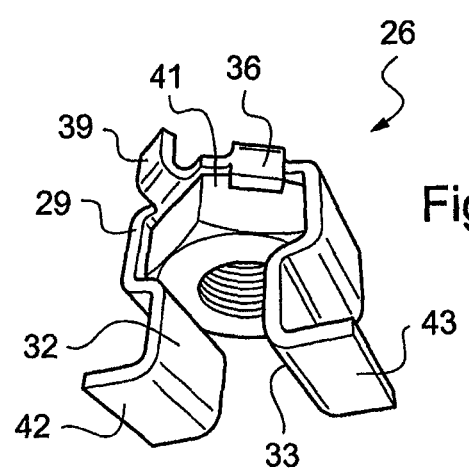
FIG. 6 is a perspective view from below of a power connection pad of the module of the invention.

Once in place, i.e. once soldered to the main substrate 16, each connection pad 26 receives a bolt 27 engaging in the thread of the nut that it encloses to fasten a power electrical connection strip, these strips being referenced 28 in FIG. 6.

As can be seen in FIGS. 5 and 6, the various pads 26, which are identical, have their top faces all at the same level once they have been soldered to the main substrate 16, thereby maintaining a gap between the connection strips 28 and the main substrate 16 once the assembly is in place.

As can be understood, a strip 28 is fastened to a pad 26 by means of a bolt 27 that passes through a hole provided in the end of the strip, and that engages in a pad 26 in such a manner as to clamp said end of the connection strip 28 firmly between the bolt head 27 and the body of the pad 26.

Each pad 26 is manufactured from a strip of copper sheet 29 cut out to define a substantially rectangular outline and to have a central orifice 31 situated between two main tabs 32 and 33 that extend in alignment with each other and that correspond to the main ends of the rectangular outline.

This cut-out strip of sheet 29 also has four tongues 36, 37, 38, and 39 extending radially outwards relative to the central region that defines the orifice 31. As can be seen in the figures, the two main tabs and the four tongues are spaced apart from one another by sixty degrees around the central orifice 31.

The main tabs 32 and 33 of said strip of sheet 29 are folded back downwards in such a manner as to enclose a hexagonal nut 41 while holding it captive. In complementary manner, the free ends 42 and 43 of said tabs 32 and 33 are folded back outwards in such a manner as to be coplanar so as to make it possible to solder them to a copper track of the main substrate 16.

In complementary manner, the tongues 36 and 38 are also folded back downwards in such a manner as to co-operate with the remainder of the strip of sheet 29 to define a cage that holds the nut 41 completely stationary, and the tongues 37 and 39 are folded back in the opposite direction, in such a manner as to protrude beyond the top face of the pad 26 in order to hold in position the connection strip 28 that the pad is to receive.

Through their general structure, these pads 26 that are made of folded copper sheet present flexibility whereby there is no risk of the differential expansions to which the module is subjected damaging the module or its connections: each pad flexes significantly in the event of differential expansion, thereby causing the mechanical stresses induced in the components of the module to decrease correspondingly.

In particular, each pad 26 presents a large amount of flexibility in a preferred direction corresponding to an axis normal to the bodies of the folded-back tabs 32 and 33.

The module of the invention also includes a power transmission bus that is connected to the pads 26 via the bolts 27, and that also constitutes a cover closing the body or the chassis of the module 14 and that is not visible in the figures.

Figure 7:
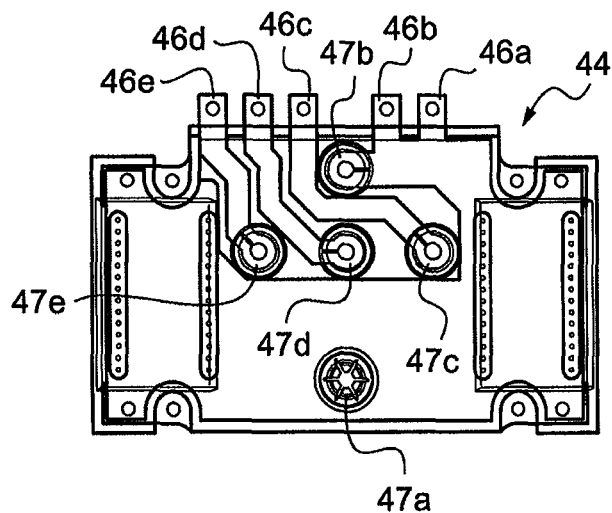
FIG. 7 is a view from above of the power bus of the power module of the invention.
Figure 8:
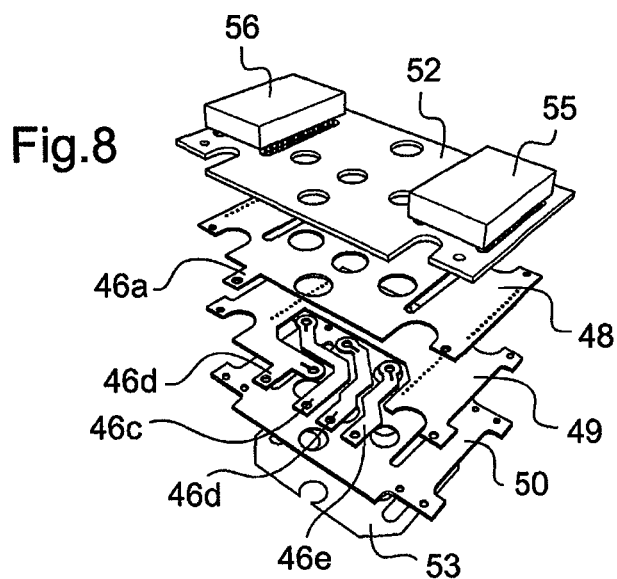
FIG. 8 is an exploded view of the power bus of the module of the invention that shows the layers making up its stack.
Figure 9:
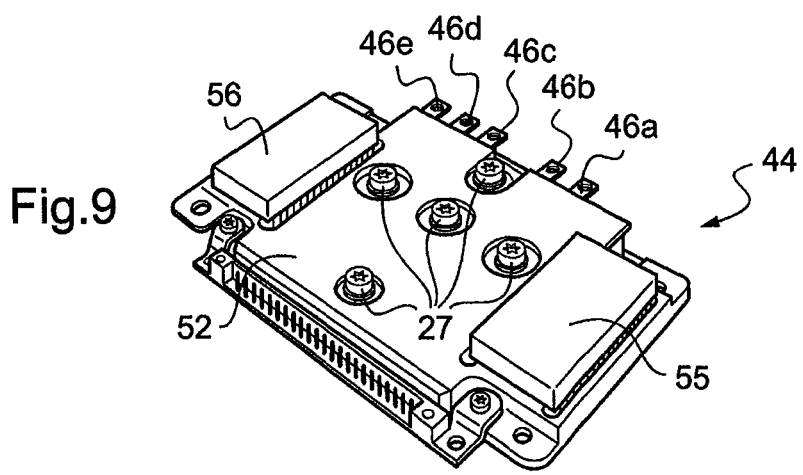
FIG. 9 is a perspective view of the power bus of the module of the invention.

This power bus, which is shown in FIGS. 7, 8 and 9, in which it is referenced 44, is the power bus that passes the high electrical currents for powering the module and the high electrical currents that the module delivers to the actuator that it controls.

In accordance with the invention, this power transmission bus, which is of a substantially plane shape that is defined by a rectangular outline, is manufactured in the form of a laminated element forming a stack of layers of copper and of layers of Kapton that form insulators.

It is provided with five external connection tongues that protrude from one of its longitudinal edges, that are referenced 46a to 46e, and that are electrically connected to five corresponding terminals 47a to 47e that are situated in the central region of the bus 44 and that are in the form of through holes having conductive external rings.

The tongue 46a is connected to the terminal 47a via the pad 28 of which it is part, and in, analogous manner, the tongues 46b, 46c, 46d, 46e are electrically connected respectively to the terminals 47b, 47c, 47d, and 47e via distinct pads 28.

These electrical connections in the bus 44 are provided by a stack of elements including three layers of copper 48, 49, and 50 shown in FIG. 8 and that are insulated from one another by layers of Kapton (not shown). In complementary manner, two additional layers 52 and 53 are mounted on the top face and on the bottom face of the bus 44, as can be seen in FIGS. 8 and 9.

The top layer of copper 48 is in the form of a plate provided with four large-diameter holes at the terminals 47b to 47e. It is provided with a smaller hole at the terminal 47a so as to form this terminal, and it is also provided with the tongue 46a that it thus connects electrically to the terminal 47a.

Figure 4:
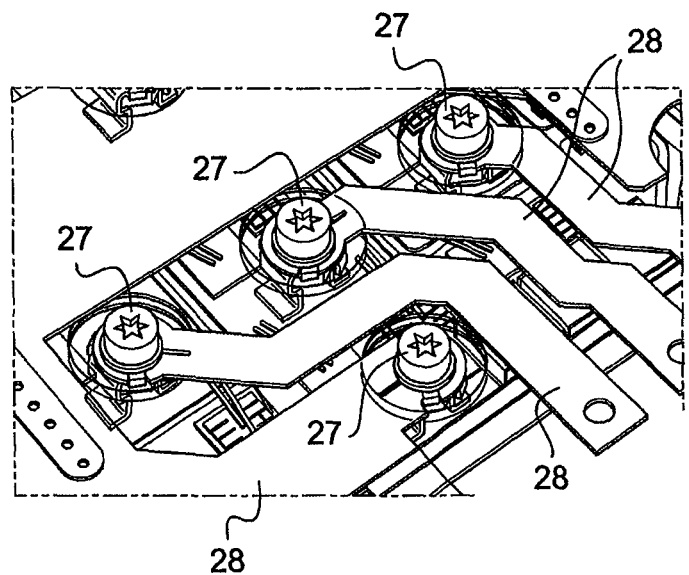
FIG. 4 is a view showing the power connection pads as connected to the power bus of the module of the invention.

The middle layer of copper 49 has four distinct copper elements that define the tongues 46a to 46e and the terminals 47b to 47e. As can be understood, each of the four elements constitutes one of the four pads 28 of FIG. 4. In other words, these four elements respectively connect the tongues 46b to 46e to the terminals 47b to 47e while being disposed in such a manner as to be electrically insulated from one another. Each terminal 47b to 47e is defined in one of these elements in the form of a hole of relatively small diameter. In addition, the element that passes via the terminal 47a has a large-diameter hole (not visible in FIG. 8) at said terminal.

The bottom layer 50 is in the form of a single copper plate defined by a substantially rectangular outline, and it comes into abutment against the chassis of the module when the bus 44 is fastened to said chassis, so that it co-operates with the chassis of the module to define a Faraday cage, i.e. a cage that isolates the internal components of the module from external electromagnetic disturbances.

As can be understood, this bottom layer of copper 50 is provided with five large-diameter holes at the terminals 47a to 47e.

As can be seen in FIG. 8, the bottom layer of insulator 53 has dimensions substantially smaller than the dimensions of the plate 50, in such a manner that the outline of said plate is clear so as to be in electrical contact with the chassis of the module when the assembly is in place.

Two additional layers of Kapton are interposed respectively between the layers 48 and 49, and between the layers 49 and 50, so that the layers are completely electrically insulated from one another.

In complementary manner, said power bus 44 carries two capacitors, referenced 55 and 56, mounted on the top layer of insulator 52, each of these capacitors being connected firstly to the top layer of copper 48, and secondly to the middle layer of copper 49 that connects the tongue 46b to the terminal 47b.

As can be seen in FIG. 9, once the bus 44 has been put into place on the chassis of the module of the invention that it equips, the bolts 27 pass through said bus at each of the terminals 47a to 47e so as to be clamped in the flexible pads 26 that are carried by the main substrate 16. Said bus thus both closes the chassis or package, thereby constituting a Faraday cage electromagnetically isolating the inverter, and also makes connections to the power supply means and to the actuator by means of the tongues 46a to 46e.

The invention claimed is:

1. An electrical power module, including power transistors, and control components for controlling said power transistors, said module being cooled by heat conduction, and said electrical power module further including:
    a main substrate of the AMB/$Si_3N_4$ type carrying the power transistors, this main substrate itself constituting a heat-dissipating baseplate for dissipating the heat generated by the power transistors by being arranged in the module to be directly in contact with the carrier structure that provides cooling by conduction when said module is in place; and
    a ceramic substrate carrying the control components, this ceramic substrate itself being carried by the main substrate.

2. The module according to claim 1, wherein the tracks of the main substrate and the tracks of the ceramic substrate carried by said main substrate are interconnected by wires, each of which has one end bonded to a track of the main substrate and another end bonded to a track of the ceramic substrate.

3. The module according to claim 1, wherein the ceramic substrate is of the thick-layer alumina type.

4. The module according to claim 1, further including power connection pads, each of which is in the form of a strip of conductive metal sheet cut out and folded to hold a clamping nut captive, each pad being fastened to the main substrate by bonding one or more ends of the folded strip of metal sheet of which it is made to a track of said substrate, each nut being arranged to receive a fastening bolt for fastening a power supply member to the pad.

5. The module according to claim 4, further including a power bus in the form of a laminated part made up of layers of copper and of Kapton and having terminals in the form of holes, this bus being fastened to the remainder of the module by means of fastening bolts passing through the module while being screwed into the pads.

6. The module according to claim 5, including a metal chassis, and wherein the power bus has a layer of copper that is in abutment against the chassis when the bus is in place, in such a manner as to co-operate with the chassis to constitute a Faraday cage.

* * * * *